(12) United States Patent
Ota et al.

(10) Patent No.: US 10,983,510 B2
(45) Date of Patent: Apr. 20, 2021

(54) OPERATION STATE MONITORING APPARATUS, LEARNING DATA GENERATION APPARATUS, METHOD AND PROGRAM

(71) Applicant: OMRON Corporation, Kyoto (JP)

(72) Inventors: Yuya Ota, Kyoto (JP); Naohiro Kawai, Kyoto (JP); Reiko Hattori, Kyoto (JP)

(73) Assignee: OMRON Corporation, Kyoto (JP)

( * ) Notice: Subject to any disclaimer, the term of this patent is extended or adjusted under 35 U.S.C. 154(b) by 122 days.

(21) Appl. No.: 16/332,816

(22) PCT Filed: Oct. 10, 2017

(86) PCT No.: PCT/JP2017/036702
§ 371 (c)(1),
(2) Date: Mar. 13, 2019

(87) PCT Pub. No.: WO2018/070388
PCT Pub. Date: Apr. 19, 2018

(65) Prior Publication Data
US 2019/0204815 A1    Jul. 4, 2019

(30) Foreign Application Priority Data

Oct. 12, 2016 (JP) .............................. JP2016-201289

(51) Int. Cl.
*G05B 19/418* (2006.01)
*H05K 13/08* (2006.01)
(Continued)

(52) U.S. Cl.
CPC ... *G05B 19/41875* (2013.01); *G05B 13/0265* (2013.01); *G05B 23/02* (2013.01);
(Continued)

(58) Field of Classification Search
USPC .......................................................... 700/47
See application file for complete search history.

(56) References Cited

U.S. PATENT DOCUMENTS 6,000,827 A      12/1999  Hosogi et al.
2010/0138026 A1*  6/2010  Kaushal ................. G06N 20/00
                                                 700/104
(Continued)

FOREIGN PATENT DOCUMENTS

CN     103489054 A     1/2014
CN     105917756 A     8/2016
(Continued)

OTHER PUBLICATIONS

English translation of the International Search Report of PCT/JP2017/036702 dated Nov. 21, 2017.
(Continued)

*Primary Examiner* — Md Azad
(74) *Attorney, Agent, or Firm* — Metrolex IP Law Group, PLLC

(57) ABSTRACT

When a product is produced at the facility, a product ID of the product to be produced and setting values of a plurality of control parameters are received from a console terminal, and a transformation model corresponding to the combination of the product ID of the product to be produced and setting values of the plurality of the control parameters is read from a transformation model storage part. Then, in accordance with the read transformation model, the reference learning data stored in a reference learning data storage part is data-transformed and individual learning data corresponding to the product to be produced is generated, and with use of the individual learning data, whether measurement data output from sensors in the facility is abnormal is discriminated.

13 Claims, 12 Drawing Sheets

(51) Int. Cl.
*G05B 23/02* (2006.01)
*G05B 13/02* (2006.01)

(52) U.S. Cl.
CPC ..... *H05K 13/0857* (2018.08); *H05K 13/0882* (2018.08); *G05B 2219/31455* (2013.01); *G05B 2219/33034* (2013.01); *Y02P 90/02* (2015.11)

(56) References Cited

U.S. PATENT DOCUMENTS

| | | | |
|---|---|---|---|
| 2013/0338810 A1 | 12/2013 | Huang | |
| 2014/0279795 A1* | 9/2014 | Shibuya | G06N 20/00 706/46 |
| 2015/0160098 A1* | 6/2015 | Noda | G05B 23/024 702/35 |
| 2015/0323425 A1* | 11/2015 | Bang | G01M 99/008 702/183 |
| 2017/0359418 A1* | 12/2017 | Sustaeta | G05B 13/024 |
| 2018/0205803 A1* | 7/2018 | Asenjo | H04L 67/10 |
| 2018/0231969 A1* | 8/2018 | Noda | G05B 23/0264 |
| 2019/0204815 A1 | 7/2019 | Ota et al. | |

FOREIGN PATENT DOCUMENTS

| | | |
|---|---|---|
| EP | 3102017 A1 | 12/2016 |
| EP | 3119176 A1 | 1/2017 |
| JP | H7-168605 A | 7/1995 |
| JP | 2002-279332 A | 9/2002 |
| JP | 2007-200044 A | 8/2007 |
| JP | 5530019 B1 | 4/2014 |
| JP | 2015088078 A | 5/2015 |
| JP | 2015-142084 A | 8/2015 |
| JP | 2015-153914 A | 8/2015 |
| JP | 5946573 B1 | 7/2016 |

OTHER PUBLICATIONS

English translation of the Written Opinion of PCT/JP2017/036702 dated Nov. 21, 2017.

The extended European search report dated Nov. 11, 2019 in a counterpart European patent application.

Office Action (CNOA) dated Jan. 6, 2021 in a counterpart Chinese patent application.

* cited by examiner

<Example of individual learning data generated by data transformation>

FIG. 12A

Product AB002

| Control parameter | Setting Value |
|---|---|
| Printing pressure | 5.00 |
| Squeegee moving amount | 200 |
| ⋮ | ⋮ |

FIG. 12B

Product CD003

| Control parameter | Setting Value |
|---|---|
| Printing pressure | 8.00 |
| Squeegee moving amount | 180 |
| ⋮ | ⋮ |

OPERATION STATE MONITORING APPARATUS, LEARNING DATA GENERATION APPARATUS, METHOD AND PROGRAM

FIELD

The present invention relates to an operation state monitoring apparatus, a learning data generation apparatus, a method, and a program for monitoring, for example, an operation state of a facility, using learning data.

BACKGROUND

In various types of facilities, such as production facilities or power generation facilities it is very important to detect operation abnormalities of the facility early in terms of preventing a decrease in operation efficiency. In view of this, a system has been proposed which detects an indicator of operation abnormality of the facility by obtaining measurement data indicating an operation state of the facility from multiple sensors, for example, and comparing the obtained measurement data with learning data that has been generated in advance (see e.g. JP 5530019 B).

SUMMARY

However, the conventionally proposed system has the following problem to be solved. Specifically, recent production facilities can produce various types of products selectively rather than producing a single type of products. As such, it is necessary to generate and store all the learning data corresponding to the various types of products to be produced before operating the system.

However, generating and storing all the learning data corresponding to the products exhaustively before operating the facility has led to a decrease in operation efficiency of the facility, because a time-consuming preparation process needs to be executed before operating the system.

Having been conceived in view of the above circumstances, the present invention aims to provide an operation state monitoring apparatus, a learning data generation apparatus, a method, and a program, according to which the operation efficiency of a facility is improved by enabling to start monitoring the operation state of the facility without generating and storing all learning data corresponding to multiple types of products to be produced at the facility.

To solve the above-described problem, a first aspect of the present invention is an operation state monitoring apparatus for monitoring, based on learning data, an operation state of a facility at which a first product and a second product are selectively produced, the operation state monitoring apparatus including: a reference learning data storage part that stores, as reference learning data, measurement data that represents a normal operation state of the facility when the first product is produced; a transformation model storage part that stores a transformation model that is set based on a difference between a normal operation state of the facility when the first product is produced and a normal operation state of the facility when the second product is produced. And, an individual learning data generation means configured to transform the reference learning data stored in the reference learning data storage part based on the transformation model stored in the transformation model storage part, and to generate individual learning data corresponding to the second product, when the second product is produced at the facility.

According to the first aspect of the present invention, when the second product is produced at the facility, individual learning data corresponding to the second product is generated by data-transforming the reference learning data that has been stored in advance for monitoring the operation state in the production of the first product, using the transformation model. This eliminates a need to generate and store all the learning data corresponding to the multiple types of products before operating the facility, and thus it is possible to simplify the preparation process performed before operating the facility, and start the operation of the facility in a shorter time period. Accordingly, the production efficiency of the facility of the producer can be improved. Additionally, since there is no need to store all the individual learning data corresponding to the products at a time, the storage capacity of the learning data storage part can be reduced.

In a second aspect of the present invention, the reference learning data storage part stores learning data generated for each of multiple control parameters defined for producing the first product, and the individual learning data generation means is configured to define the same control parameters as for the first product also for the second product, and to generate the individual learning data corresponding to the second product, for each of the defined multiple control parameters.

According to the second aspect of the present invention, in a case where there are multiple control parameters for the second product similarly to the first product, individual learning data for each control parameter can be also generated for the second product.

In a third aspect of the present invention, the individual learning data generation means is configured to use, as the transformation model, a transformation equation in which estimated values of the individual learning data corresponding to the second product are calculated by adding a difference between a setting value and the actual measurement values included in the reference learning data, to the setting value indicating the normal operation state set for the second product.

According to the third aspect of the present invention, as the transformation model, a transformation equation is used in which the estimated value of the individual learning data corresponding to the second product is calculated by adding a difference between the actual measurement value included in the reference learning data and the setting value to the setting value indicating the normal operation state set for the second product. This makes it possible to perform data transformation suited to a condition, under the condition that the actual measurement value of the operation state when the first product is produced is in accordance with normal distribution in which the average is the setting value, and the standard deviation of the actual measurement value does not depend on the setting value.

In a fourth aspect of the present invention, the individual learning data generation means is configured to use, as the transformation model, a transformation equation, with which an estimated value of individual learning data corresponding to the second product are calculated by multiplying a difference between the actual measurement values and the setting value in the reference learning data with the ratio between the standard deviations of the first and second products, and adding the setting value indicating the normal operation state set for the second product to the calculated values after the multiplication.

According to the fourth aspect of the present invention, as the transformation model, a transformation equation is used in which the estimated value of the individual learning data corresponding to the second product is calculated by multiplying the difference between the actual measurement value of the reference learning data and the setting value by the ratio between the standard deviations of the first and second products, and adding the calculated value obtained by the multiplication to the setting value indicating the normal operation state set for the second product. This makes it possible to perform data transformation suited to a condition under the condition that the actual measurement value of the operation state when the first product is produced is in accordance with the normal distribution in which the average is the setting value and the standard deviation of the actual measurement value is proportional to the setting value.

In a fifth aspect of the present invention, the operation state monitoring apparatus includes: a discrimination means configured to discriminate an operation state of the facility when the second product is produced, based on individual learning data generated with the individual learning data generation means; a display means configured to display, on a display device, information representing the discrimination result obtained by the discrimination means; a receiving means configured to receive a correction instruction for correcting the individual learning data, and an execution means configured to cause the individual learning data generation means to perform a process for re-generating the individual learning data to be corrected in accordance with the received correction instruction.

According to the fifth aspect of the present invention, information indicating the discrimination result of the operation state of the facility at the production of the second product is displayed in the display device. When an operator confirms this display and inputs a correction instruction of the individual learning data, for example, the individual learning data is re-generated in accordance with the correction instruction. As such, for example, in a case where the operation state of the facility is determined to be abnormal but the operation state of the facility itself can be discriminated to be within a normal range, it is possible to re-generate the individual learning data.

A sixth aspect of the present invention is a learning data generation apparatus that is capable of data transmission with an operation state monitoring apparatus that monitors, based on learning data stored in advance, an operation state of a facility at which a first product and a second product are selectively produced, the learning data generation apparatus including: a transformation model storage part that stores a transformation model that is set based on a difference between a normal operation state of the facility when the first product is produced and a normal operation state of the facility when the second product is produced; an obtaining means configured to obtain from the operation state monitoring apparatus, when producing the second product, reference learning data indicating a normal operation state of the facility when the first product is produced; an individual learning data generation means configured to transform the obtained reference learning data based on a transformation model stored in the transformation model storage part and to generate individual learning data corresponding to the second product, and an output means configured to output the generated individual learning data to the operation state monitoring apparatus.

According to the sixth aspect of the present invention, installing the external learning data generation apparatus to the operation state monitoring apparatus that merely stores the reference learning data makes it possible to implement the present invention while an existing operation state monitoring apparatus is continuously used, for example.

In other words, according to the aspects of the present invention, it is possible to provide an operation state monitoring apparatus, a learning data generation apparatus, a method, and a program thereof, according to which monitoring of the operation state of the facility can be started without generating and storing all the learning data corresponding to multiple types of the products to be produced at the facility, thereby improving the operation efficiency of the facility.

BRIEF DESCRIPTION OF THE DRAWINGS

FIG. 12A is a diagram illustrating an example of setting values of printing pressure and squeegee moving amount set for one product, used in the substrate mounting line shown in FIG. 11.

FIG. 12B is a diagram illustrating an example of setting values of printing pressure and squeegee moving amount set for another product, used in the substrate mounting line shown in FIG. 11.

DETAILED DESCRIPTION

Hereinafter, embodiments according to the present invention will be described with reference to the drawings.

Embodiment 1

Configuration

Figure 1:
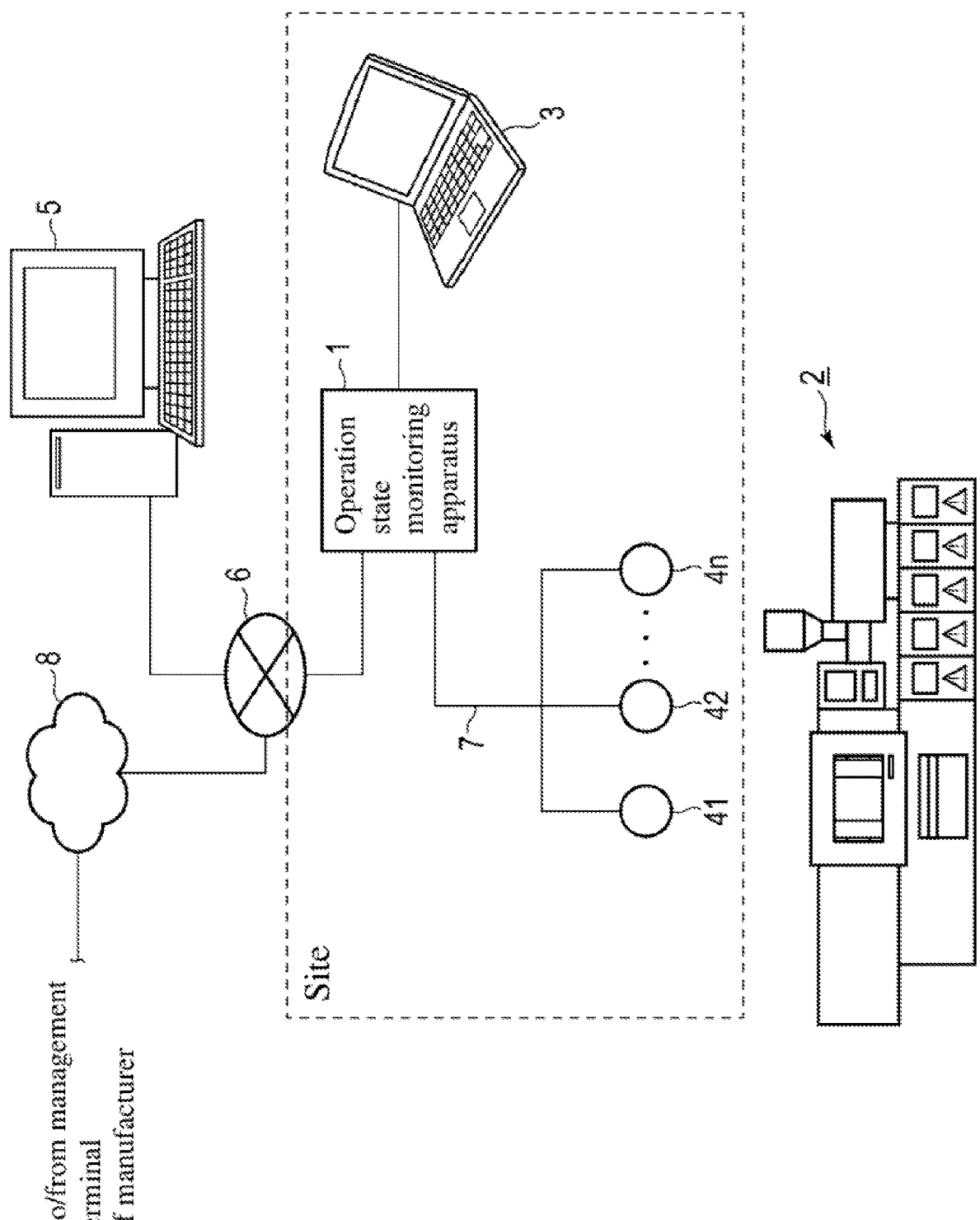
FIG. 1 is a schematic configuration diagram of a production management system including an operation state monitoring apparatus according to an embodiment of the present invention.

FIG. 1 is a schematic configuration diagram of a production management system including an operation state monitoring apparatus according to an embodiment of the present invention, and 2 in FIG. 1 illustrates a facility such as a manufacturing apparatus which is the object of production management.

The facility 2 is capable of meeting a demand for multi-product small-batch production, and can selectively produce multiple kinds of products. Here, "production" includes all the processes required for producing the product such as assembly, processing, sewing, packaging, printing, and so on, of the product, rather than merely manufacturing of the product.

The production management system is constituted by apparatuses arranged at a site where the facility 2 is installed and an apparatus arranged in an office.

Of these, the apparatuses arranged at the site include a plurality of sensors 41 to 4n for measuring the operation state of the facility 2, an operation state monitoring apparatus 1, and a console terminal 3. The sensors 41 to 4n are constituted by, for example, an analog temperature sensor, a vibration sensor, an image sensor, and output measurement data on the temperature, vibration, and the like, which indicate the operation state, and image data obtained by imaging the facility 2, during the operation of the facility 2. The measurement data and image data output from the sensors 41 to 4n is transmitted to the operation state monitoring apparatus 1 via a network 7 such as an Ethernet (registered trademark) network.

On the other hand, an apparatus arranged in the office is constituted by a management server 5. The management server 5 receives and accumulates information indicating discrimination results regarding the operation state of the facility 2 that is transmitted from the operation state monitoring apparatus 1 via a local area network 6 such as LAN (Local Area Network) or wireless LAN. Then, based on the accumulated information indicating the discrimination results, the management server 5 performs production management processing such as daily confirmation of the operation state of the facility 2, identification of a product or a process in which failures occur frequently, reporting the operation state to the site, and the like. Note, that the management server 5 is also connected to a management terminal used by a manufacturer of the facility 2 via a public network 8 including the Internet, and thus the management server 5 can notify the manufacturer of data on abnormalities and failures at the facility 2.

Figure 2:
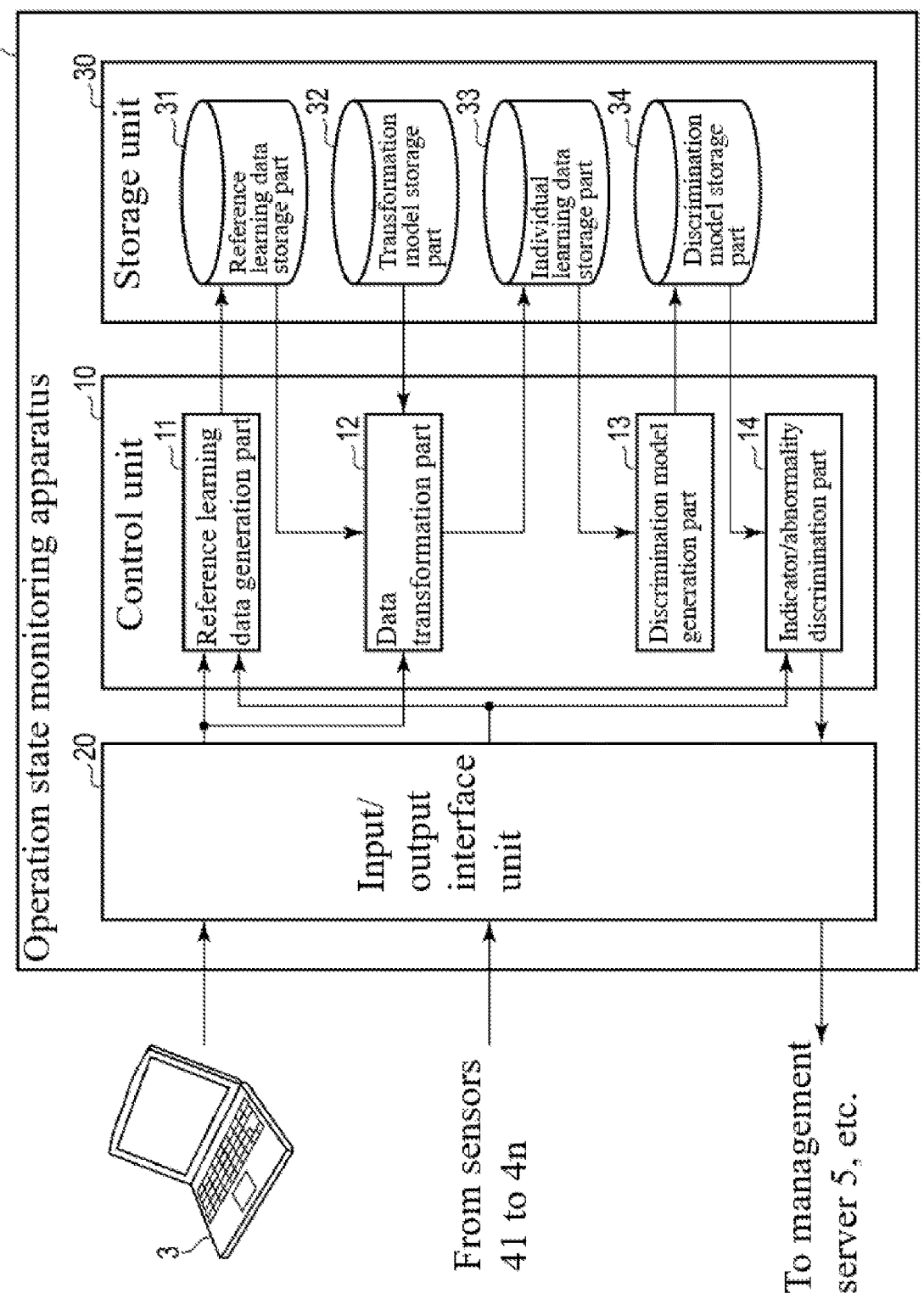
FIG. 2 is a block diagram illustrating a functional configuration of the operation state monitoring apparatus in the production management system shown in FIG. 1.

The operation state monitoring apparatus 1 is configured as follows. FIG. 2 is a block diagram illustrating an example of the functional configuration.

Specifically, the operation state monitoring apparatus 1 includes a control unit 10, an input-output interface unit 20, and a storage unit 30 as hardware.

The input-output interface unit 20 has a function of receiving measurement data, image data transmitted from the sensors 41 to 4n and command data output from the console terminal 3, and outputting the received data to the control unit 10. The input-output interface unit 20 also has a function of transmitting, to the management server 5 or the management terminal of the manufacturer, data indicating indicator/abnormality discrimination results that are output from the control unit 10 via the local area network 6.

The storage unit 30 uses a nonvolatile memory such as an SSD (solid state drive) or an HDD (hard disk drive) that is capable of writing and reading as needed as a storage medium. Note that a volatile memory such as a RAM can also be used as the storage medium. The storage unit 30 includes a reference learning data storage part 31, a transformation model storage part 32, an individual learning data storage part 33, and a discrimination model storage part 34 as storage regions used to realize the present embodiment.

Of these, the transformation model storage part 32 stores a plurality of transformation models in association with product IDs for identifying the product that is planned to be produced, and with control parameters to be used in the production processes of the product. "Control parameters" mean parameters to be controlled in the facility when a product is produced. In a substrate mounting line, for example, the control parameters include printing pressure, printing speed, and printing position of a printer, mounting position of a mounting machine, furnace temperature of a reflow furnace. Additionally, conveyor speed, torque of a robot arm, heater current, and the like are also possible as control parameters.

The transformation model is used as a transformation rule that is used when the reference learning data stored in the reference learning data storage part 31 is data-transformed to generate the individual learning data, and is expressed by a transformation equation.

The control unit 10 includes a hardware processor called a CPU (central processing unit) or the like, a program memory, and a working memory, as hardware. A reference learning data generation part 11, the data transformation part 12, a discrimination model generation part 13, and an indicator/abnormality discrimination part 14, serving as control function parts that are required to implement the present embodiment can be realized by software. Note that all these control function parts are realized by causing the hardware processor to execute application programs stored in the program memory.

In a state where a learning mode is designated, the reference learning data generation part 11 receives the product ID and setting data of the control parameters from the console terminal 3, and also receives the measurement data in a state where the facility 2 operates normally from the sensors 41 to 4n, at a given time interval and over a predetermined learning period. Then, the reference learning data generation part 11 associates the measurement data in the normal operation state with the product ID and setting data for each control parameter, and stores the data in the reference learning data storage part 31 as the reference learning data.

The data transformation part 12 performs the processing described below in a case where a discrimination mode for discriminating an operation abnormality of the facility 2 is designated.

(1) Processing for receiving, from the console terminal 3, input of the product ID of the product to be produced and setting values of the plurality of the control parameters, and reading the transformation model corresponding to the combinations of the product ID and each of the control parameters from the transformation model storage part 32.

(2) Processing for data-transforming the reference learning data stored in the reference learning data storage part 31 in accordance with the read transformation model, and storing the transformed data in the individual learning data storage part 33 as the individual learning data.

The discrimination model generation part 13 generates a discrimination model for discriminating operation abnormality of the facility 2 based on the individual learning data stored in the individual learning data storage part 33, and stores the generated discrimination model in the discrimination model storage part 34.

The indicator/abnormality discrimination part 14 discriminates whether the measurement data output from the sensors of the facility 2 is normal or abnormal, in accordance with the discrimination model stored in the discrimination model storage part 34. Then, the indicator/abnormality discrimination part 14 sends information indicating the discrimination result to the management server or the like (not shown) from the input-output interface unit 20. Note that the discrimination result does not have to be binary (normal/abnormal), but may be a multi-value discrimination (normal/abnormal/indicative), or may be the extent of abnormality of the measurement data compared to the individual learning data (e.g. the Mahalanobis distance between the learning data and the measurement data, as in the MT method), and the like may also be included in the method for discrimination, in addition to the binary discrimination for discriminating whether the data is normal or abnormal.

Operation

Next, the operation of the operation state monitoring apparatus 1 configured as above will be described.

Figure 3:
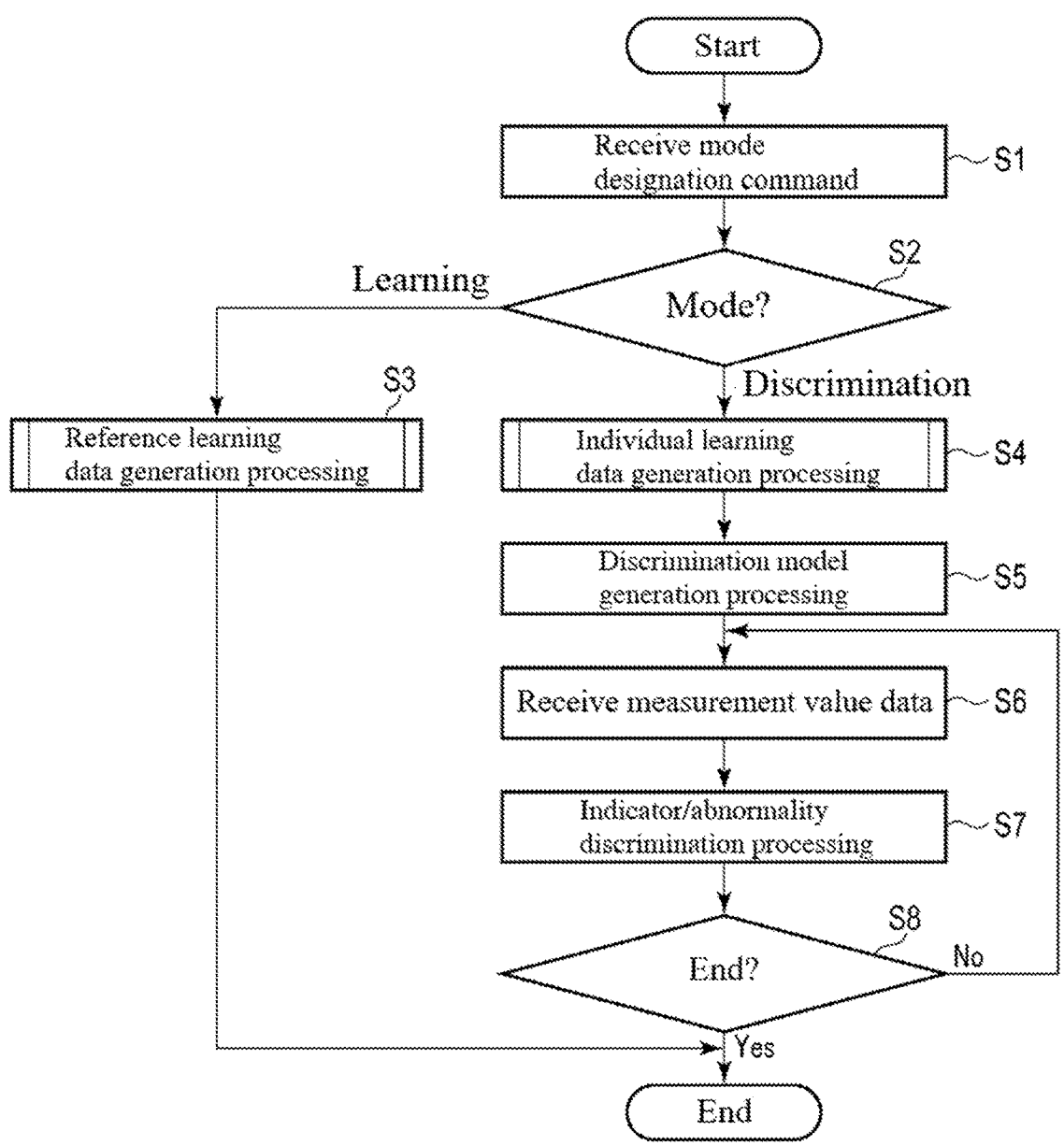
FIG. 3 is a flowchart illustrating a procedure and contents of a main routine of the operation state monitoring control performed by the operation state monitoring apparatus shown in FIG. 2.

FIG. 3 is a flowchart illustrating an example of the whole processing procedure of the operation monitoring apparatus 1 and of processing contents.

(1) Generation of Reference Learning Data

The operation state monitoring apparatus 1 monitors command input from the console terminal 3. In this state, when an operator performs an operation for designating a learning mode with the console terminal 3, the designation command is sent to the operation state monitoring apparatus 1.

Figure 4:
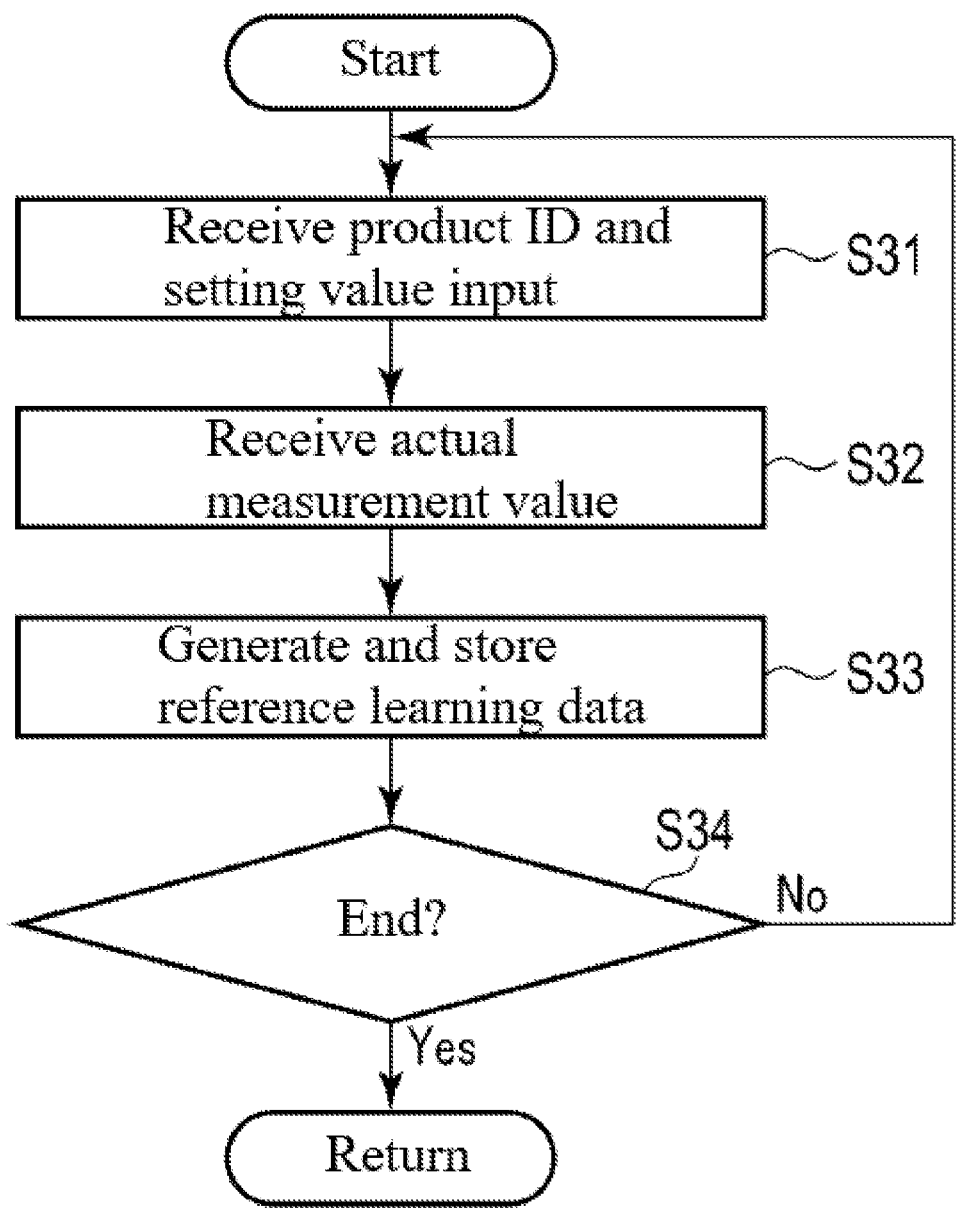
FIG. 4 is a flowchart illustrating the procedure and contents of the reference learning data generation processing in the main routine shown in FIG. 3.

In step S1, the operation state monitoring apparatus 1 receives the mode designation command sent from the console terminal 3 via the input-output interface unit 20. In step S2, the operation state monitoring apparatus 1 then determines whether the received mode designation command designates the learning mode or the discrimination mode. If the determination result indicates that the mode designation command designates the learning mode, the operation state monitoring apparatus 1 then moves to step S3, and thereafter, the operation state monitoring apparatus 1 executes processing for generating the reference learning data under the control of the reference learning data generation part 11, as will be described below. FIG. 4 is a flowchart illustrating an example of the processing procedure and processing contents.

Specifically, first the operator starts up the facility 2, and starts the operation for producing the product for which the reference learning data is to be generated. Then, the operator inputs, to the console terminal 3, the product ID of the product for which the reference learning data is to be generated, and logical setting values of the plurality of control parameters corresponding to the normal operation state.

In step S31, the reference learning data generation part 11 receives the product ID and setting data indicating setting values of the control parameters, sent from the console terminal 3 via the input-output interface unit 20. Next, in step S32, during the production operation in the facility 2, the reference learning data generation part 11 receives the measurement data output from the sensors 41 to 4n for each control parameter, via the input-output interface unit 20 at a given time interval. Then, the reference learning data generation part 11 associates the measurement data received for each control parameter at a given time interval with the product ID and the setting values of the plurality of control parameters input from the console terminal 3, and stores the data in the reference learning data storage part 31 as the reference learning data.

The reference learning data generation processing described as above is performed over a predetermined learning period. Then, in step S34, upon determining that the above learning period has elapsed, the reference learning data generation part 11 ends the processing for generating the reference learning data.

Figure 9:
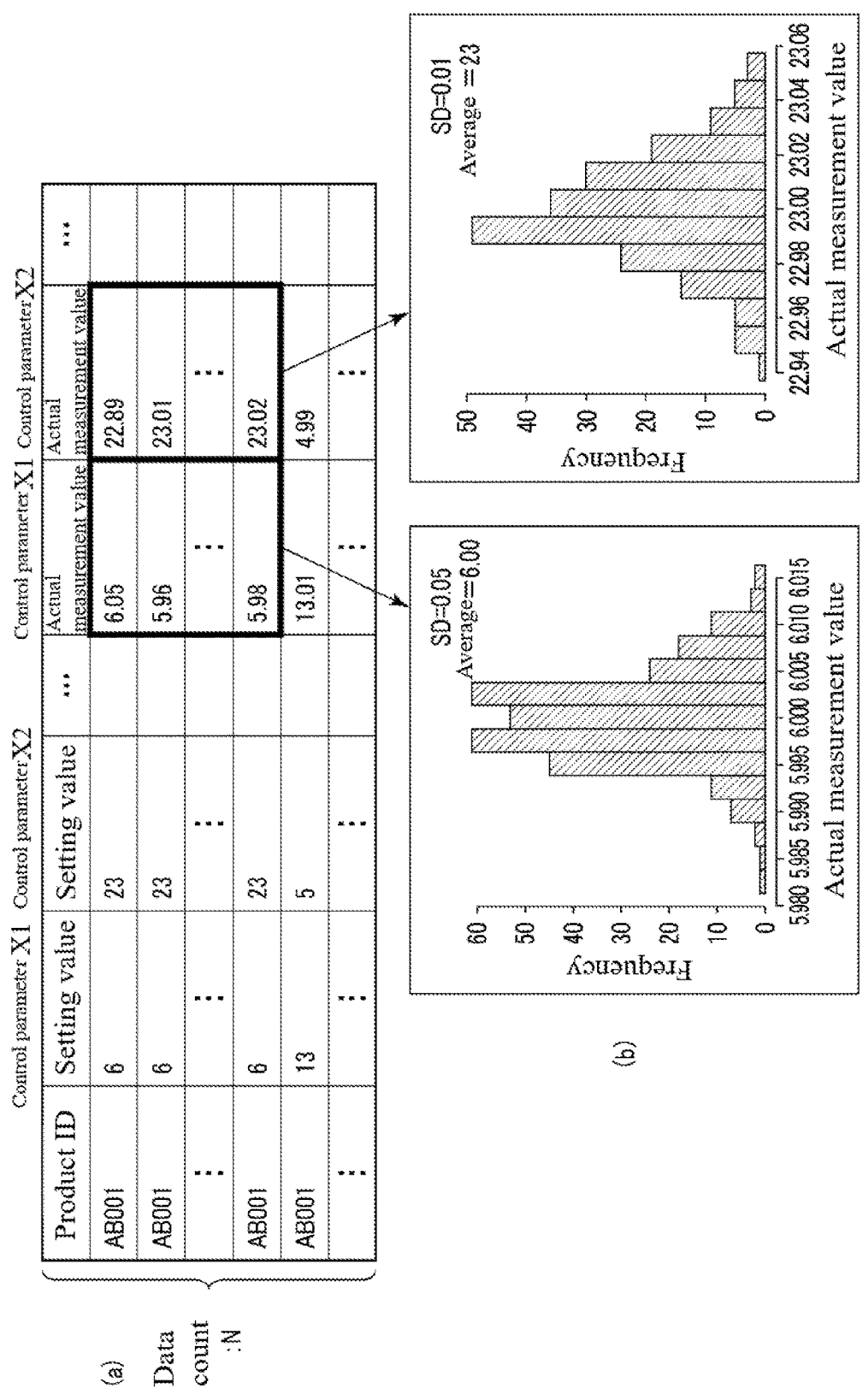
FIG. 9 is a diagram illustrating an example of reference learning data generated by the reference learning data generation processing shown in FIG. 4 and a frequency distribution of the actual measurement values.

FIG. 9A illustrates an example of the reference learning data generated as described above. FIG. 9A illustrates a case in which, in a product having product ID "AB001", the actual measurement values "6.05", "22.89" . . . , obtained for each of the control parameters X1, X2, . . . , at a given time interval are stored in association with the setting values "6", "23", . . . , of the control parameters X1, X2, . . . . FIG. 9B is a diagram illustrating a frequency distribution of the above actual measurement values obtained for each of the above control parameters X1, X2, . . . .

(2) Monitoring Operation State of Facility

When intending to monitor the operation state of the facility 2, the operator first inputs the designation command for designating the discrimination mode to the console terminal 3.

In step S1, the operation state monitoring apparatus 1 then receives the mode designation command input by the console terminal 3 via the input-output interface unit 20. Then, in step S2, the operation state monitoring apparatus 1 determines whether the received mode designation command designates the learning mode or the discrimination mode. If the determination result indicates that the mode designation command designates the discrimination mode, the operation state monitoring apparatus 1 then executes monitoring control of the operation state of the facility 2.

(2-1) Generating Individual Learning Data

Figure 5:
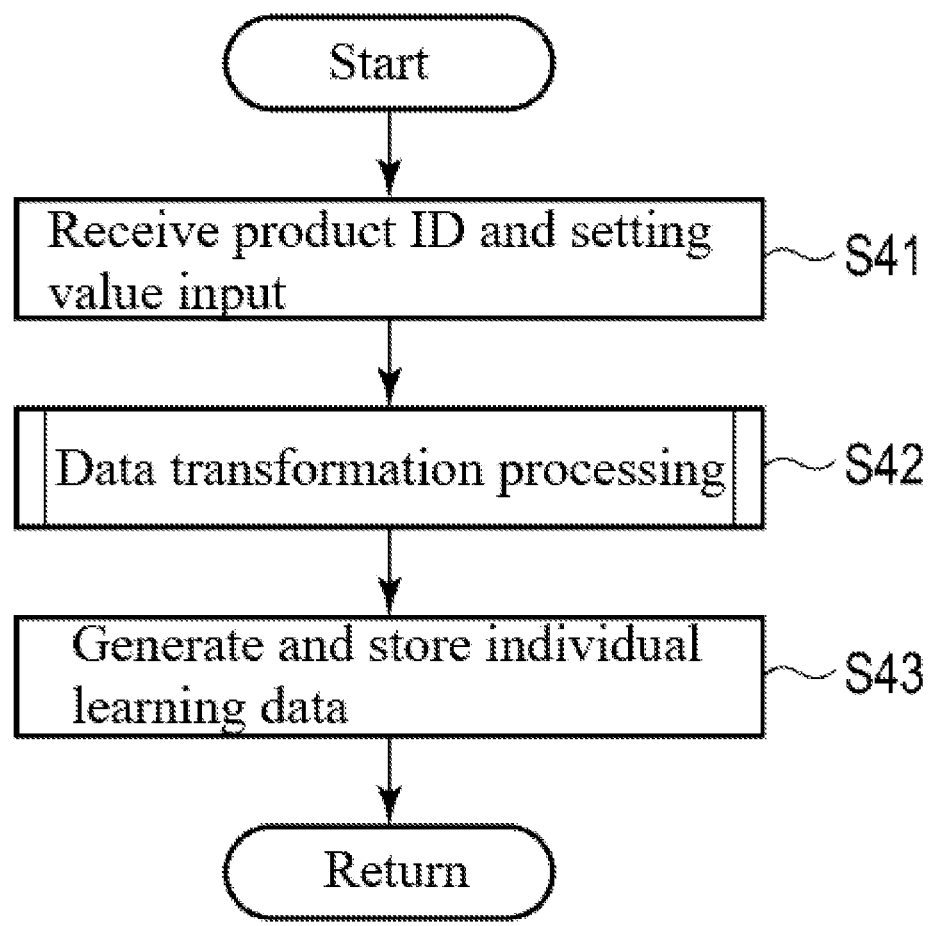
FIG. 5 is a flowchart illustrating the procedure and contents of the individual learning data generation processing in the main routine shown in FIG. 3.

First, the operation state monitoring apparatus 1 moves to step S4, and executes individual learning data generation processing under the control of the data transformation part 12 as described below. FIG. 5 is a flowchart illustrating an example of the processing procedure and processing contents.

Figure 6:
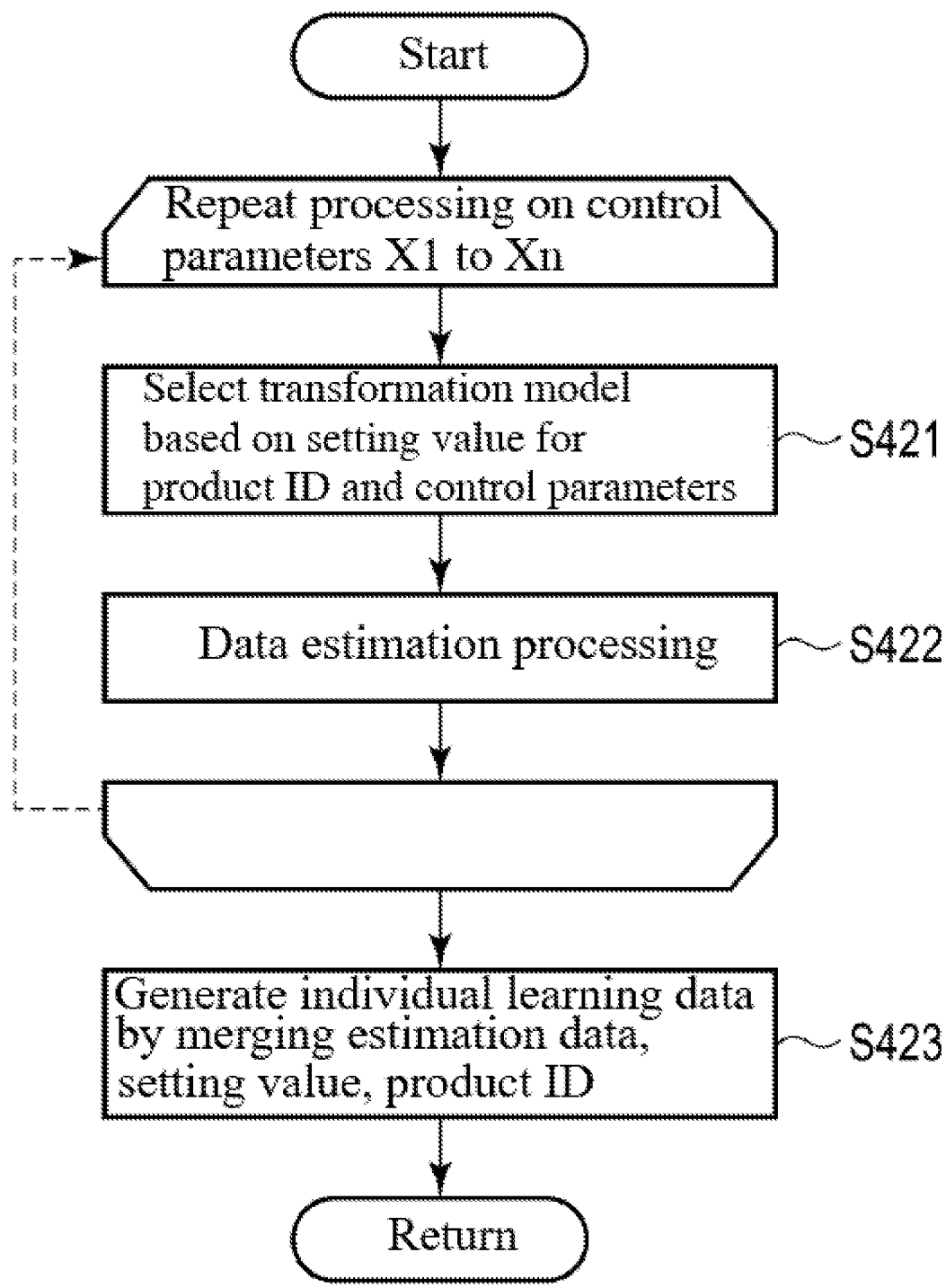
FIG. 6 is a flowchart illustrating the procedure and contents of data transformation processing in the individual learning data generation processing shown in FIG. 5.

The operator inputs, to the console terminal 3, the product ID of the product to be produced at the facility 2 and setting values of the control parameters. In step S41, the data transformation part 12 receives the product ID of the product to be produced and the setting values of the control parameters that are input to the console terminal 3, via the input-output interface unit 20. Then, in step S42, the data transformation part 12 executes data transformation processing as described below. FIG. 6 is a flowchart illustrating an example of the processing procedure and processing contents.

Specifically, for example, when the control parameters are denoted as X1 to Xn, in step S421, with respect to the control parameter X1 first, the data transformation part 12 selectively reads the corresponding transformation model from the transformation model storage part 32 based on the product ID and the setting value of the control parameter X1 as keys. Then, in step S422, the transformation part 12 performs data-transformation on the reference learning data stored in the reference learning data storage part 31 in accordance with the read transformation model.

Hereinafter, a specific example of transformation processing on the learning data will be described.

First Example

A first example is applied to a case where the actual measurement values of the control parameter X1 of the product AB001 are in accordance with a normal distribution in which the average is the setting value of the control parameter X1, and the standard deviation of the actual measurement values does not depend on the setting value.

For example, with respect to the control parameter X1 of the product AB001, when the setting value is X1AB001 (set) and the actual measurement value is X1AB001 (msr), and with respect to the control parameter X1 of the product CD002 that is planned to be produced, the setting value is X1CD002(set), and the estimated value is X1CD002(msr), the transformation equation of the transformation model can be expressed as:

$$X1CD002(msr)=X1AB001(msr)-X1AB001(set)+X1CD002(set) \quad (1)$$

Figure 7:
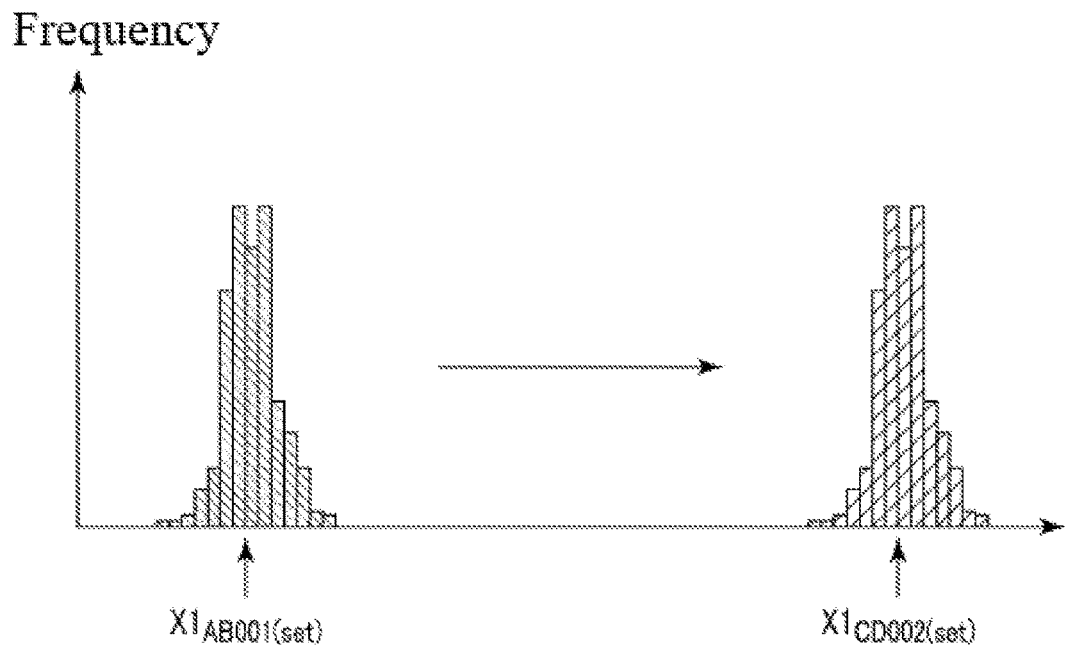
FIG. 7 is a diagram illustrating a first example of a transformation model used for the data transformation processing shown in FIG. 6.

Then, when the data of the control parameter X1 of the reference learning data is transformed using this transformation equation (1), the data of the control parameter X1 of the product CD002 is as shown in FIG. 7.

Second Example

A second example is applied to a case where, with respect to the reference learning data of the product AB001, the actual measurement values of the control parameter X1 is in accordance with a normal distribution in which the average is the setting value of the control parameter X1, and the standard deviation of the actual measurements value is proportional to the setting value.

In the control parameter X1 of the product AB001, for example, when the setting values are X1AB001(set1) and X1AB001(set2), and the standard deviations are σ1X1AB001 and σ2X1AB001, the standard deviation σX1CD002 of the product CD002 can be estimated using an equation expressed as:

$$\sigma X1CD002=(\sigma 2X1AB001-\sigma 1X1AB001))/(X1AB001(set2)-X1AB001(set1))\times(X1CD002(set)-X1AB001(set1))+\sigma 1X1AB001$$

Note that, as the estimation equation, the following equation can also be used.

$$\sigma X1CD002=(\sigma 2X1AB001-\sigma 1X1AB001)/(X1AB001(set2)-X1AB001(set1))\times(X1CD002(set)-X1AB001(set2))+\sigma 2X1AB001$$

The transformation equation of the transformation model for calculating the estimated value X1CD002(msr) of the product CD002 from the above estimation equation can be expressed as:

$$X1CD002(msr)=\sigma X1CD002/\sigma X1AB001(X1AB001(msr)-X1AB001(set))+X1CD002(set) \quad (2)$$

Figure 8:
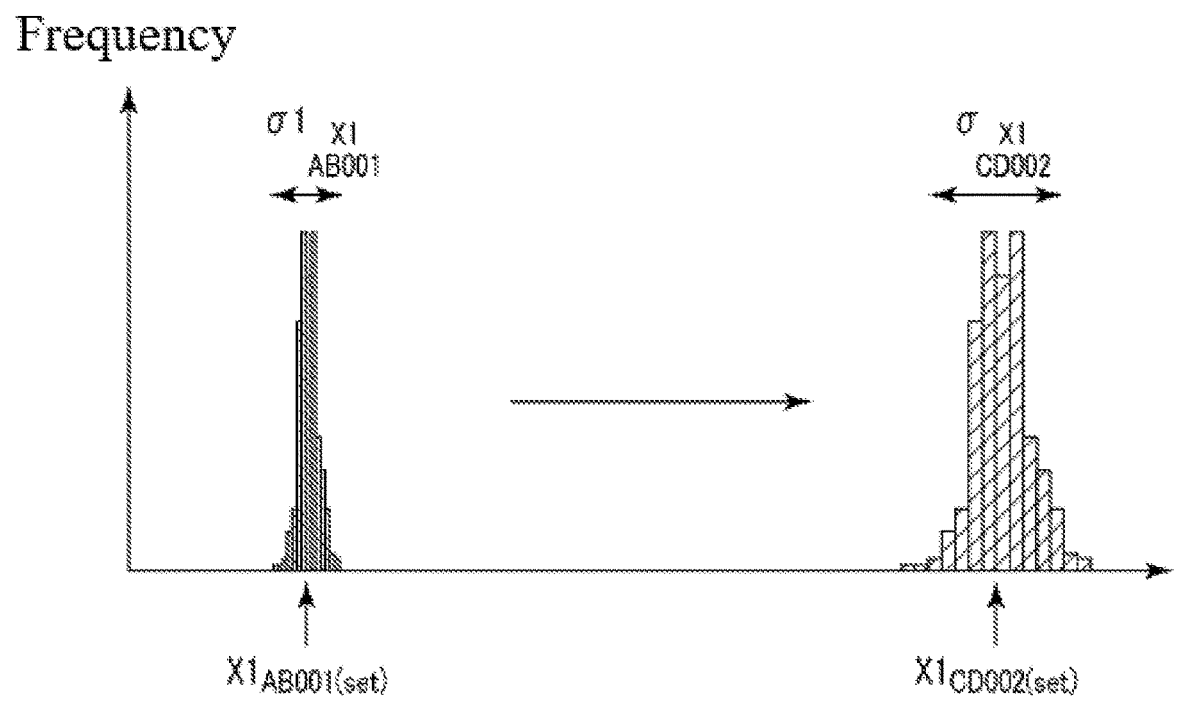
FIG. 8 is a diagram illustrating a second example of the transformation model used for the data transformation processing shown in FIG. 6.

When data on the control parameter X1 of the reference learning data is transformed using this transformation equation (2), the data on the control parameter X1 of the product CD002 is as shown in FIG. 8.

In the above steps S421 to S422, the data transformation part 12 sequentially executes data transformation processing on the remaining control parameters X2 to Xn, using the transformation model for each. Upon completing transformation processing on the control parameters X2 to Xn, in step S423, the data transformation part 12 generates the individual learning data corresponding to the product CD002 by merging the data on the estimated values generated through the data transformation processing with the product ID and the setting values of the control parameters X1 to Xn that have been received in step S41.

Figure 10:
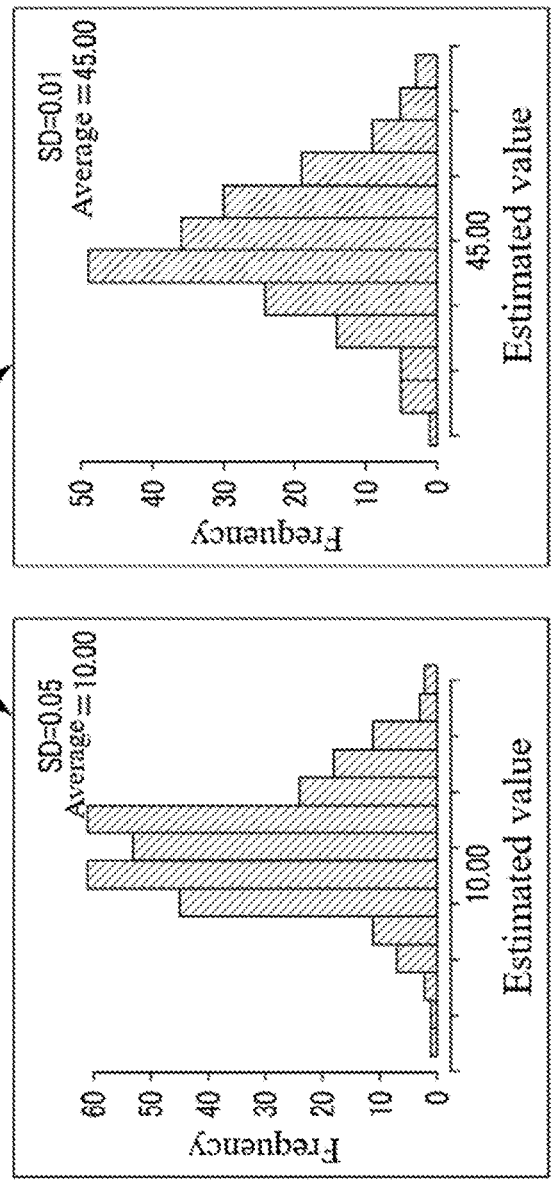
FIG. 10 is a diagram illustrating an example of individual learning data generated by the individual learning data generation processing shown in FIG. 5 and a frequency distribution of the estimated values.

FIG. 10A is a diagram illustrating an example of individual learning data generated as described above, and FIG. 10B is a diagram illustrating the frequency distribution of the estimated values for each of the control parameters X1, X2, and so on. Note, that the individual learning data shown in FIGS. 10A and 10B is generated by using the transformation equation (1) described in the first example.

Finally, in step S43, the data transformation part 12 stores the generated individual learning data in the individual learning data storage part 33. Note that a new piece of individual learning data may be stored additionally and sequentially in the individual learning data storage part 33 every time when a new piece of individual learning data is generated, or a new piece of individual learning data may also be overwritten over the existing learning data and stored every time when a new piece of individual learning data is generated.

If the additionally-storing method is adopted, it is no longer necessary to re-generate the same individual learning data, thus making it possible to reduce the processing load on the operation state monitoring apparatus 1 and shorten the time period required before starting indicator/abnormality discrimination processing. On the other hand, if the overwriting-and-storing method is adopted, the storage capacity of the individual learning data storage part 33 can be kept to the capacity for a single piece of individual learning data.

Working Example

Figure 11:
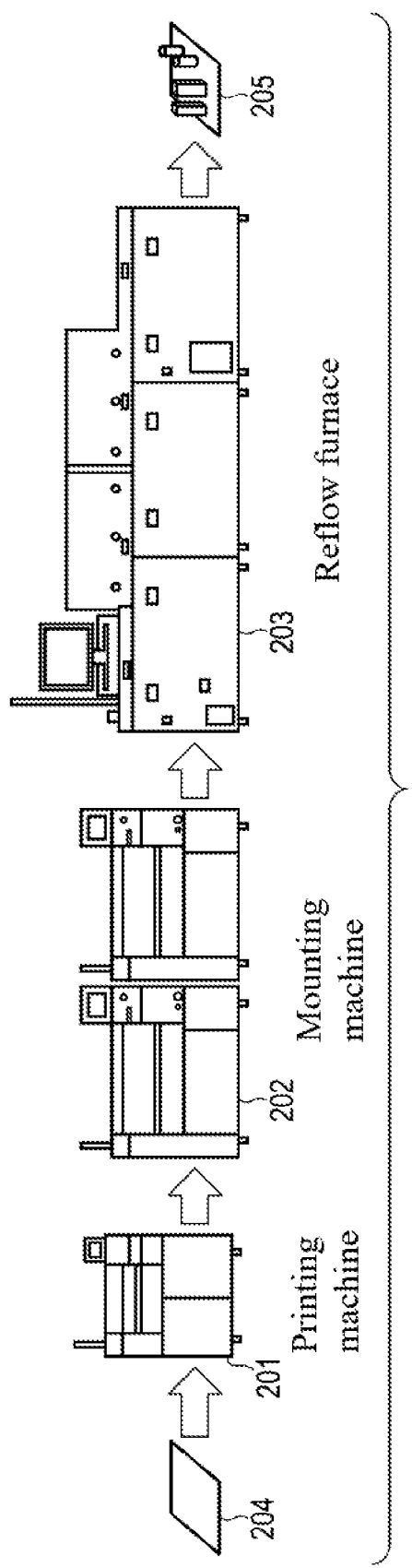
FIG. 11 is a schematic configuration diagram of a substrate mounting line that is a working example of the production management system according to an embodiment of the present invention.

Hereinafter, a working example will be described in which the method for generating the individual learning data as described above is applied to a substrate mounting line. FIG. 11 illustrates an example of a schematic configuration of a substrate mounting line. The substrate mounting line includes a printing machine 201, a mounting machine 202, and a reflow furnace 203, for example. First, the printing machine 201 prints paste-like or cream-like solder on required positions on a print substrate 204 that has been introduced, with use of a squeegee. Next, the mounting machine 202 places surface mounting components on prescribed positions in the print substrate 204 that has been conveyed from the above printing machine 201, with use of a chip mounter. Finally, the reflow furnace 203 melts the solder by heating the print substrate that has been conveyed from the mounting machine 202, and solders the surface mounting components onto circuit patterns formed on the print substrate. 205 in FIG. 11 illustrates a product that has been conveyed out from the reflow furnace 203.

Incidentally, in the printing machine 201, printing pressure and moving amount of the squeegee are set to the optimal values for each product, and are defined as the control parameters X1 and X2. FIG. 12A illustrates an example of setting values of a printing pressure and a moving amount of the squeegee that are set for the product AB002, and FIG. 12B illustrates an example of setting values of the printing pressure and the moving amount of the squeegee that are set for the product CD003.

When the method for generating the individual learning data according to the present embodiment is applied to the above-described solder printing process performed by the printing machine 201, the data transformation part 12 performs the data transformation processing described below. Specifically, first, the data transformation part 12 selectively reads the corresponding transformation model from the transformation model storage part 32 based on the product ID (CD003) and the setting value of the control parameter X1 (printing pressure) as keys. Then, the transformation part 12 performs data-transformation on the reference learning data stored in the reference learning data storage part 31 in accordance with the read transformation model.

When an example is taken in which the actual measurement values of the control parameters X1 of the product AB002 and CD003 are in accordance with the normal distribution the average of which is the setting value of the control parameter X1, and the standard deviation of the actual measurement value does not depend on the setting value, processing is performed such that data for the control parameter X1 of the reference learning data is transformed into data for the control parameter X1 of the product CD003, with use of the transformation equation (1) that was described earlier in the first example.

Figure 13:
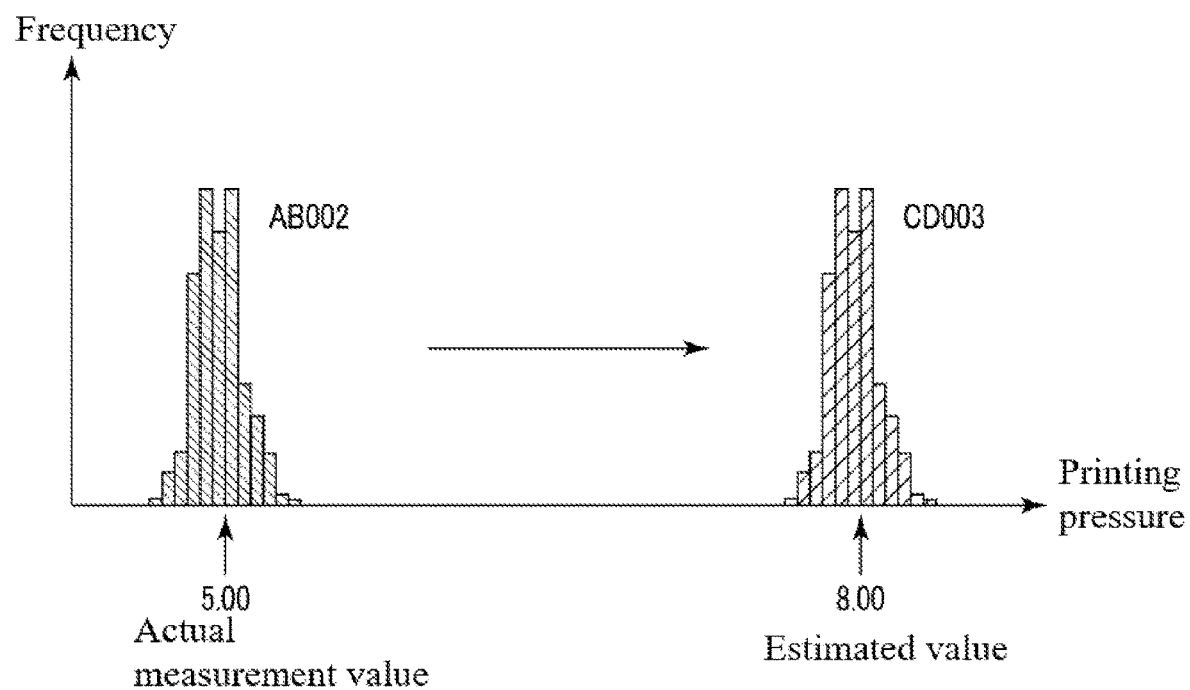
FIG. 13 is a diagram illustrating an example of the transformation model used when individual learning data is estimated from the reference learning data shown in FIGS. 12A and 12B.

FIG. 13 illustrates the frequency distribution of the transformed estimated values. Note that, although an example in which the actual measurement value of the product AB002 coincides with the setting value shown in FIG. 12A was described with reference to FIG. 13, the present invention can also be applied to a case in which there is a difference between the actual measurement value and the setting value. Even if there is a difference between the actual measurement value and the setting value, it is possible to calculate the estimated value of the product CD003 and generate the individual learning data by considering the difference with use of the transformation equation.

Similarly, with respect to the control parameter X2 (squeegee moving amount), processing is also performed such that data on control parameter X1 of the product AB002 is transformed into data for the control parameter X2 of the product CD003 with use of the transformation equation (1). Note, that it goes without saying that it is also possible to use the transformation equation (2) that was mentioned in the second example.

Thereafter, the estimated values of the control parameters X1 and X2 of the product CD003, that were generated through the above data-transformation processing are stored in the individual learning data storage part 33 as the individual learning data of the product CD003.

Note that, although the above specific example illustrated a case in which the individual data generation method according to the present invention is applied to printing process performed by the printing machine 201, the individual data generation method according to the present invention may also be applied to a mounting process performed by the mounting machine 202 and a reflow process performed by the reflow furnace 203.

(2-2) Generation of Discrimination Model

Upon completing generation of the individual learning data, in step S5, the operation state monitoring apparatus 1 then generates a discrimination model under the control of the discrimination model generation part 13. The individual learning data is classified into a plurality of clusters through K-means, EM algorithm, or the like, for example. An EM algorithm repeats the E (Expectation) step and the M (Maximization) step alternately, and in the E step, an expectation value of the likelihood of the model is calculated based on the distribution of latent variables that are currently estimated. In the M step, a parameter for maximizing the expectation value of the likelihood that was calculated in the E step is calculated. The parameter calculated in the M step is used to discriminate the distribution of the latent variables used for the next E step. The discrimination model generation part 13 stores the plurality of clusters generated as described above in the discrimination model storage part 34.

(2-3) Discrimination on Indicator/Abnormality

Upon completing generation of the discrimination model, in step S6, the operation state monitoring apparatus 1 then receives the measurement data sent from the sensors in the facility 2 via the input-output interface unit 20 at a given time interval, under the control of the indicator/abnormality discrimination part 14. Then, in step S7, the operation state monitoring apparatus 1 selects a cluster that is close to the measurement data out of a plurality of clusters stored in the discrimination model storage unit 34, for example, calculates the distance between the measurement data and the selected cluster, and discriminates whether the measurement data is abnormal, based on the calculated distance.

The indicator/abnormality discrimination part 14 transmits information indicating the discrimination result to the management server 5 from the input-output interface unit 20 via the local area network 6 every time when the discrimination result is obtained, or every time when the discrimination results in a predetermined time period are accumulated. The management server 5 attaches a time stamp indicating the timing of discrimination to the information indicating the discrimination result sent from the operation state monitoring apparatus 1, and accumulates the information chronologically. Then, based on the accumulated information indicating the discrimination results, the management server 5 performs production management processing such as daily checking of the operation state of the facility 2, identification of a product or a process in which failures occur frequently, and reporting the operation state to the site.

Also, the indicator/abnormality discrimination part 14 may include the functions described below. For example, a plurality of discrimination thresholds may be set to determine the extent of the abnormality in the measurement data. If the abnormality exceeds a warning level, or, even if an abnormality does not exceed the warning level, but discrimination results indicating an abnormality are obtained consecutively over a predetermined time period or for a predetermined number of times, then the indicator/abnormality discrimination part 14 transmits the discrimination result to the management terminal of the manufacturer via the local area network 6 and the public network 8, as alarm information. Due to the alarm information, an operator at the manufacturer can quickly perceive and handle the operation abnormality or the indicator thereof in the facility 2.

Effect of Embodiment

As described above in detail in the embodiment of the present invention, the transformation model storage part 32 and the data transformation part 12 are provided as well as the reference learning data generation part 11 for generating the reference learning data corresponding to a given product and the reference learning data storage part 31 for storing the reference learning data. Then, when a product other than the given product is produced at the facility 2, the product ID of the product to be produced and the setting values of the plurality of the control parameters thereof are received from the console terminal 3, and the transformation model corresponding to the combination of the product ID of the product to be produced and setting values of the plurality of the control parameters is read from the transformation model storage part 32. Then, individual learning data corresponding to the above-described product to be produced is generated by data-transforming the reference learning data stored in the reference learning data storage part 31 in accordance with the read transformation model, and whether the measurement data output from the sensors in the facility 2 is abnormal is discriminated using the individual learning data.

Accordingly, when producing the product, the individual learning data is generated by data-transforming the reference learning data that has been generated in advance using the transformation model, and whether the measurement data detected at the time of producing the above product is discriminated based on this individual learning data. For this reason, it is no longer necessary to store the learning data corresponding to all the products to be produced in advance, and thus the preparing process before starting up the facility 2 can be simplified, and the facility 2 can be started up in a shorter time. Additionally, since there is no need to store the learning data corresponding to all the products to be produced in advance, the storage capacity of the learning data storage part can be greatly reduced.

Furthermore, as the transformation model, using the linear transformation equation shown in equation (1) makes it possible, under the condition that the actual measurement value of the control parameter X1 of the product AB001 is in accordance with the normal distribution in which the average value is the setting value, and that the standard deviation of the actual measurement value is not dependent on the setting value, to perform transformation suited to those conditions.

Furthermore, as the transformation model, using the transformation equation shown in equation (2) makes it possible, under the condition that the actual measurement value of the control parameter X1 of the product AB001 is in accordance with a normal distribution in which the average value is the setting value, and that the standard deviation of the actual measurement value is proportional to the setting value, to perform data-transformation suited to those conditions.

Other Embodiments

In the above embodiment, although the reference learning data of the product AB001 is generated and stored in the operation state monitoring apparatus 1, a configuration is also possible in which generation of the reference learning data is performed in another device and the operation state monitoring apparatus 1 receives the reference learning data from the abovementioned other device and stores the received data in the reference learning data storage part 31. Furthermore, although the above embodiment illustrated a case in which the production system is arranged separately, namely at the site where the facility 2 is installed and at the office, all the apparatuses constituting the production system may also be arranged at the site.

As the transformation model, it is also possible to use an affine transformation for data-transformation with use of a combination of Euclidean-geometry-like liner transformation and parallel translation, a skew transformation in which the two-dimensional distribution of the data is obliquely inclined, a rotation transformation in which the two-dimensional distribution of the data is rotated, or a translation transformation in which the whole data is shifted without changing the contents, in addition to liner transformation.

Furthermore, the above embodiment illustrated a case in which the transformation model storage part 32 and the data transformation part 12 are provided in the operation state monitoring apparatus 1. However, a configuration is also possible in which the transformation model storage part 32 and the data transformation part 12 are provided in a learning data generation apparatus that is separated from the operation state monitoring apparatus 1.

In this case, the operation state monitoring apparatus 1 and the learning data generation apparatus are connected to each other via a signal cable or a network. Then, the learning data generation apparatus generates the individual learning data based on the product ID of the product to be produced and the setting value for each control parameter input from the console terminal 3, the reference learning data obtained from the operation state monitoring apparatus 1, and transfers the generated learning data to the operation state monitoring apparatus 1 and stores the generated data therein. Note that, similarly to the operation state monitoring apparatus 1, the learning data generation apparatus is provided with a processor and a memory, and realizes various control functions by executing programs by the above processor.

Also, the operation state monitoring apparatus 1 may also include the following control function. Specifically, even when the operation state of the facility 2 is determined to be abnormal, in a case where the operation state of the facility 2 itself can be discriminated to be within the normal range, it can be inferred that there is a gap between the estimated value of the individual learning data and the actual learning data.

As such, in this case, the operation state monitoring apparatus 1 causes the console terminal 3 to display a massage for requesting the correction of the individual learning data of the product to be produced, for example. In response to this message, the operator sets the operation state monitoring apparatus 1 to the learning mode, and inputs the correction instruction information for instructing re-generation of the learning data of the product to be produced. This correction instruction includes the instruction for changing the transformation model to be selected, or the instruction for changing the setting value for the control parameter of the transformation model. In response to the above correction instruction, the operation state monitoring apparatus 1 performs a process for generating the learning data of the product to be produced and stores the re-generated individual learning data in the individual learning data storage part 33. By doing this, in the operation state monitoring apparatus 1, when performing production operation of the product to be produced next time, indicator/abnormality discrimination processing is performed based on the above re-generated individual learning data.

Alternatively, in response to an input operation by the operator, the operation state monitoring apparatus 1 corrects the transformation model corresponding to the above product to be produced, and replaces the corresponding transformation model stored in the transformation model storage part 32 with the above corrected transformation model. By doing this, in the operation state monitoring apparatus 1, when starting production operation of the abovementioned product to be produced next time, the individual learning data corresponding to the above product to be produced is generated in accordance with the corrected transformation model. Thereafter, indicator/abnormality discrimination processing is executed based on the re-generated individual learning data.

Note, that the above processing for correcting transformation model may also be autonomously executed by the operation state monitoring apparatus 1. In this case, in a case where the actual measurement value separated from the estimated value by a predetermined value or more is obtained, for example, the correction process may be realized by calculating the direction and amount of the gap and correcting the setting value of the transformation equation based on the calculation result, or replacing the transformation equation with another transformation equation.

Furthermore, the above embodiment described the case in which the reference learning data corresponding to the product AB001 as the first product is generated and stored in advance, and when producing the product CD002 as the second product that is different from the product AB001, the individual learning data corresponding to the product CD002 is generated and the operation state of the facility is monitored. However, a configuration is also possible in which, when producing the product that is the same as the product AB001 and has different setting values of the control parameter, the individual learning data corresponding to the product is generated and the operation state of the facility is monitored. In this case, the above configuration can be realized by giving a product ID (e.g. AB001-2) that is different from that of the product AB001 to the product that is the same as the product AB001 and has different setting values of the control parameter, and handling the product AB001-2 as the second product. With this configuration, data-transformation of the present invention is also applicable to a case in which the control parameters are partly changed in order to improve the production efficiency of the first product.

Furthermore, various modifications on the type of facility, the configuration of production system, and the configuration, control procedure, and control detail of operation state monitoring apparatus, the type of transformation model, the type of product to be produced and so on can be made without departing from the spirit of the present invention.

In short, the present invention is not limited to the above-described embodiments as they are, and may be embodied with modifying constituent elements without departing from the spirit of the present invention. In addition, various inventions can be made by combining the plurality of constituent elements disclosed in the above-described embodiments as appropriate. Some of constituent elements may be deleted from all the constituent elements shown in the embodiments, for example. Furthermore, constituent elements in the different embodiments can be combined as appropriate.

In addition, a part or all of the above-mentioned aspects of the embodiments may be described as in the following, but the present invention is not limited to the following.

Addendum 1

An operation state monitoring apparatus for monitoring, based on learning data, an operation state of a facility at which a first product and a second product are selectively produced, the operation state monitoring apparatus including:

a hardware processor and a memory, wherein
the memory includes
a reference learning data storage part that stores, as reference learning data, measurement data that represents a normal operation state of the facility when the first product is produced;
a transformation model storage part that stores a transformation model that is set based on a difference between a normal operation state of the facility when the first product is produced and a normal operation state of the facility when the second product is produced, and
when the second product is produced at the facility, the hardware processor transforms the reference learning data stored in the reference learning data storage part based on the transformation model stored in the transformation model storage part, and generates individual learning data corresponding to the second product, when the second product is produced at the facility.

Addendum 2

A learning data generation apparatus that is capable of data transmission with an operation state monitoring apparatus (1) that monitors, based on learning data stored in advance, an operation state of a facility (2) at which a first product and a second product are selectively produced, the learning data generation apparatus including:

a hardware processor and a memory,
the memory has
a transformation model storage part that stores a transformation model that is set based on a difference between a normal operation state of the facility when the first product is produced and a normal operation state of the facility when the second product is produced, and
the hardware processor
obtains, from the operation state monitoring apparatus, when producing the second product, reference learning data indicating a normal operation state of the facility when the first product is produced;
transforms the obtained reference learning data based on a transformation model stored in the transformation model storage part and generates individual learning data corresponding to the second product, and
outputs the generated individual learning data to the operation state monitoring apparatus.

Addendum 3

A learning data generation method executed by an operation state monitoring apparatus that monitors an operation state of a facility at which a first product and a second product are selectively produced based on learning data, the method including:

reading, using at least one hardware processor, when the second product is produced at the facility, reference learning data indicating a normal operation state when the first product is produced, from a reference learning data storage part;
reading, using at least one hardware processor, from a transformation model storage part, a transformation model that is set based on a difference between a normal operation state of the facility when the first product is produced and a normal operation state of the facility when the second product is produced, and
data-transforming the read reference learning data, based on the read transformation model, and estimating individual learning data indicating a normal operation state of the facility when the second product is produced, using at least one hardware processor.

The invention claimed is:

1. An operation state monitoring apparatus for monitoring, based on learning data, an operation state of a facility at which a first product and a second product, different from the first product, are selectively produced, the operation state monitoring apparatus comprising:
a reference learning data memory storing reference learning data comprising measurement data that represents a normal operation state of the facility in response to the first product being produced;
a transformation model memory storing a transformation model that is set based on a difference between a normal operation state of the facility in response to the first product being produced and a normal operation state of the facility in response to the second product produced; and a processor configured with a program to perform operations comprising:
in response to the second product being produced at the facility, generating individual learning data corresponding to the second product by transforming the reference learning data based on the transformation model;
discriminating an operation state of the facility in response to the second product being produced, based on the generated individual learning data;
displaying, on a display device, information representing a discrimination result obtained by the discrimination;
receiving a correction instruction for correcting the individual learning data; and
performing a process for re-generating the individual learning data to be corrected in accordance with the received correction instruction.

2. The operation state monitoring apparatus according to claim 1, wherein the reference learning data memory stores learning data generated for each of first multiple control parameters defined for producing the first product, and
the processor is configured with the program to perform operations further comprising defining, for the second product second multiple control parameters that are the same as the first multiple control parameters for the first product, and generating the individual learning data corresponding to the second product, for each of the defined second multiple control parameters.

3. The operation state monitoring apparatus according to claim 1, wherein the processor is configured with the program to perform operations comprising using, as the transformation model, a transformation equation in which estimated values of the individual learning data corresponding to the second product are calculated by adding a difference between a setting value and actual measurement values included in the reference learning data, to the setting value indicating the normal operation state set for the second product.

4. The operation state monitoring apparatus according to claim 1, wherein the processor is configured with the program to perform operations comprising using as the transformation model, a transformation equation, with which an estimated value of individual learning data corresponding to the second product is calculated by multiplying a difference between actual measurement values and a setting value in the reference learning data with a ratio between standard deviations of the first and second products, and adding the setting value indicating the normal operation state set for the second product to the calculated values after the multiplication.

5. A learning data generation apparatus that is capable of data transmission with an operation state monitoring apparatus that monitors, based on learning data stored in advance, an operation state of a facility at which a first product and a second product, different from the first product, are selectively produced, the learning data generation apparatus comprising:
a transformation model memory storing a transformation model that is set based on a difference between a normal operation state of the facility in response to the first product being produced and a normal operation state of the facility in response to the second product being produced; and
a processor configured with a program to perform operations comprising:
obtaining from the operation state monitoring apparatus, in response to producing the second product, reference learning data indicating the normal operation state of the facility in response to the first product being produced;
generating, in response to obtaining the reference learning data, individual learning data corresponding to the second product by transforming the obtained reference learning data based on the transformation model;
discriminating an operation state of the facility in response to the second product being produced, based on the generated individual learning data;
displaying, on a display device, information representing a discrimination result obtained by the discrimination;
receiving a correction instruction for correcting the individual learning data; and
performing a process for re-generating the individual learning data to be corrected in accordance with the received correction instruction; and
outputting the generated individual learning data to the operation state monitoring apparatus.

6. A learning data generation method executed by an operation state monitoring apparatus that monitors an operation state of a facility at which a first product and a second product, different from the first product, are selectively produced based on learning data, the method comprising:
reading, in response to the second product being produced at the facility, reference learning data indicating a normal operation state in response to the first product being produced, from a reference learning data memory;
reading, from a transformation model memory, a transformation model that is set based on a difference between the normal operation state of the facility in response to the first product being produced and a normal operation state of the facility in response to the second product being produced;
generating, in response to obtaining the reference learning product, individual learning data corresponding to the second product by transforming the reference learning data based on the transformation model;
discriminating an operation state of the facility in response to the second product being produced, based on the generated individual learning data;
displaying, on a display device, information representing a discrimination result obtained by the discrimination;
receiving a correction instruction for correcting the individual learning data; and
performing a process for re-generating the individual learning data to be corrected in accordance with the received correction instruction.

7. The learning data generation method according to claim 6, further comprising:
storing in the reference learning data memory, learning data generated for each of first multiple control parameters defined for producing the first product;
defining for the second product, second multiple control parameters that are the same as the first multiple control parameters; and
generating the individual learning data corresponding to the second product, for each of the defined second multiple control parameters.

8. The learning data generation method according to claim 6, further comprising using, as the transformation model, a transformation equation in which estimated values of the individual learning data corresponding to the second product are calculated by adding a difference between a setting value and actual measurement values included in the reference learning data, to the setting value indicating the normal operation state set for the second product.

9. The learning data generation method according to claim 6, further comprising using, as the transformation model, a transformation equation, with which an estimated value of individual learning data corresponding to the second product is calculated by multiplying a difference between actual measurement values and a setting value in the reference learning data with a ratio between standard deviations of the first and second products, and adding the setting value indicating the normal operation state set for the second product to the calculated values after the multiplication.

10. A non-transitory computer-readable storage medium storing a program, which when read and executed by a processor of an operation state monitoring apparatus that monitors an operation state of a facility at which a first product and a second product, different from the first product, are selectively produced based on learning data, causes the processor to perform operations comprising:
  reading, in response to the second product being produced at the facility, reference learning data indicating a normal operation state in response to the first product being produced, from a reference learning data memory;
  reading, from a transformation model memory, a transformation model that is set based on a difference between the normal operation state of the facility in response to the first product being produced and a normal operation state of the facility in response to the second product being produced;
  generating, in response to obtaining the reference learning product, individual learning data corresponding to the second product by transforming the reference learning data based on the transformation model;
  discriminating an operation state of the facility in response to the second product being produced, based on the generated individual learning data;
  displaying, on a display device, information representing a discrimination result obtained by the discrimination;
  receiving a correction instruction for correcting the individual learning data; and
  performing a process for re-generating the individual learning data to be corrected in accordance with the received correction instruction.

11. The non-transitory computer-readable storage medium according to claim 10, wherein the program, when read and executed, causes the processor to perform operations further comprising:
  storing in the reference learning data memory, learning data generated for each of first multiple control parameters defined for producing the first product;
  defining for the second product, second multiple control parameters that are the same as the first multiple control parameters; and
  generating the individual learning data corresponding to the second product, for each of the defined second multiple control parameters.

12. The non-transitory computer-readable storage medium according to claim 10, wherein the program, when read and executed, causes the processor to perform operations further comprising using, as the transformation model, a transformation equation in which estimated values of the individual learning data corresponding to the second product are calculated by adding a difference between a setting value and actual measurement values included in the reference learning data, to the setting value indicating the normal operation state set for the second product.

13. The non-transitory computer-readable storage medium according to claim 10, wherein the program, when read and executed, causes the processor to perform operations further comprising using, as the transformation model, a transformation equation, with which an estimated value of individual learning data corresponding to the second product is calculated by multiplying a difference between actual measurement values and a setting value in the reference learning data with a ratio between standard deviations of the first and second products, and adding the setting value indicating the normal operation state set for the second product to the calculated values after the multiplication.

* * * * *